(12) United States Patent
Murakami et al.

(10) Patent No.: US 7,528,575 B2
(45) Date of Patent: May 5, 2009

(54) METHOD AND APPARATUS FOR CORRECTING VOLTAGE OF SECONDARY BATTERY, AND METHOD AND APPARATUS FOR ESTIMATING STATE OF CHARGE OF SECONDARY BATTERY

(75) Inventors: Yusai Murakami, Hamamatsu (JP); Norito Yamabe, Toyohashi (JP)

(73) Assignee: Panasonic EV Energy Co., Ltd., Kosai-Shi (JP)

( * ) Notice: Subject to any disclaimer, the term of this patent is extended or adjusted under 35 U.S.C. 154(b) by 506 days.

(21) Appl. No.: 10/567,799

(22) PCT Filed: Apr. 19, 2004

(86) PCT No.: PCT/JP2004/005572

§ 371 (c)(1),
(2), (4) Date: Feb. 9, 2006

(87) PCT Pub. No.: WO2005/017545

PCT Pub. Date: Feb. 24, 2005

(65) Prior Publication Data

US 2006/0273802 A1    Dec. 7, 2006

(30) Foreign Application Priority Data

Aug. 14, 2003 (JP) ............... 2003-293529

(51) Int. Cl.
*H01M 10/44* (2006.01)
(52) U.S. Cl. .................................... 320/132
(58) Field of Classification Search ............. 324/426, 324/427, 430, 433; 320/132, 149
See application file for complete search history.

(56) References Cited

U.S. PATENT DOCUMENTS

| 2003/0097225 | A1* | 5/2003 | Teruo ...................... 702/63 |
| 2004/0095143 | A1* | 5/2004 | Laig-Hoerstebrock et al. .................. 324/426 |
| 2005/0017685 | A1* | 1/2005 | Rees et al. ............... 320/132 |
| 2005/0189916 | A1* | 9/2005 | Bucur .................... 320/128 |

FOREIGN PATENT DOCUMENTS

| JP | 9-15311 | 1/1997 |
| JP | 2002-334726 | 11/2002 |
| WO | EP 1679523 | * 12/2006 |

* cited by examiner

*Primary Examiner*—Edward Tso
(74) *Attorney, Agent, or Firm*—Workman Nydegger

(57) ABSTRACT

The present invention provides an apparatus for correcting a voltage of a secondary battery, wherein accuracy in measurement of battery voltages between battery blocks in different voltage measurement systems. In a battery ECU (101), the following components are disposed: a first voltage measuring part (102-1), a second voltage measuring part (102-2), a third voltage measuring part (102-3) and a fourth voltage measuring part (102-4) which are disposed in different voltage measurement systems so as to measure voltages of plural battery blocks; a representative voltage calculating part (105) for calculating representative voltages from battery voltages measured by the first to fourth voltage measuring parts; a voltage correction value calculating part (107) for calculating voltage correction values on the basis of the respective representative voltages; and a correction value reflecting part (109) for adding the voltage correction values to measured voltages of battery blocks in the respective corresponding voltage measurement systems.

18 Claims, 2 Drawing Sheets

METHOD AND APPARATUS FOR CORRECTING VOLTAGE OF SECONDARY BATTERY, AND METHOD AND APPARATUS FOR ESTIMATING STATE OF CHARGE OF SECONDARY BATTERY

TECHNICAL FIELD

The present invention relates to a method for measuring the voltage of a secondary battery such as a nickel-metal hydride (Ni-MH) battery to be mounted as a power source for a motor and a driving source for various loads, in a pure electric vehicle (PEV), a hybrid electric vehicle (HEV), and the like, and for estimating State of Charge (SOC) on the basis of the thus measured voltage.

BACKGROUND ART

Conventionally, in an HEV, the voltage, current, temperature and the like of a secondary battery are detected, and the state of charge (hereinafter, abbreviated as an "SOC") of the secondary battery is estimated by computation, whereby an SOC is controlled so as to optimize the fuel consumption efficiency of a vehicle. In order to control the SOC exactly, it is necessary to estimate exactly the SOC of the secondary battery being charged/discharged.

Conventionally, the following methods have been known for estimating SOC from a battery voltage. First, several sets of data for voltage V and a charging/discharging current I are acquired and stored in a predetermined period of time, from which a primary approximate line (a voltage (V)-current (I) approximate line) is calculated, and a V section of the V-I approximate line is calculated as a battery voltage (Voc) (no-load voltage). In addition, an accumulated value ∫I of the current I is calculated, and a polarization voltage Vp of the battery is obtained from a function including temperature T, battery voltage Voc, and current accumulated value ∫I, as variables. Electromotive force E is obtained by subtracting the polarization voltage Vp from the battery voltage Voc. Next, by referring to a previously-provided electromotive force—SOC characteristic, SOC is estimated from the thus obtained electromotive force E.

A secondary battery to be mounted on HEV or the like is configured as a battery pack formed by combining plural battery blocks formed by connecting plural cells or unit cells in series. For finding SOC at every battery block, typically the SOC calculation is performed at each battery block.

Therefore, the accuracy in SOC calculation in this case relies directly on the accuracy in measurement of the battery voltage. Accuracy in measurement of the battery voltage will be influenced by random errors, offset errors, aging errors or the like.

However, the above-mentioned conventional methods of estimating SOC from a battery voltage have problems as mentioned below.

While the voltage random error imposes fewer influences on the SOC estimation errors between the battery blocks, the voltage offset error occurs easily in the voltage between battery blocks whose voltage measurement systems are different from each other. When using a highly-accurate voltage sensor or a voltage detection circuit system for securing voltage offset error of not more than several tens of milli-volts, the cost will be raised. For this reason, a low-cost product with poor accuracy is used reluctantly in development of an inexpensive product. This will increase the estimation error of SOC between electrode blocks.

DISCLOSURE OF INVENTION

Therefore, with the foregoing in mind, it is an object of the present invention to provide a method and an apparatus for correcting a voltage of a secondary battery where the accuracy in measurement of the battery voltage between battery blocks corresponding to different voltage measurement systems is improved, thereby providing a method and an apparatus for estimating SOC accurately even when the measured battery voltage includes an offset error.

For achieving the object, a method for correcting a voltage of a secondary battery according to the present invention relates to a method for correcting battery voltages measured in a battery system having plural voltage measurement systems and having plural secondary batteries in each of the voltage measurement systems, and the method includes a step of calculating representative voltages from battery voltages measured in the respective voltage measurement systems, a step of calculating voltage correction values on the basis of the calculated representative voltages respectively, and a step of correcting the measured voltages of the secondary batteries in each of the voltage measurement systems, on the basis of the voltage correction values.

It is preferable in the method for correcting a voltage of a secondary battery according to the present invention that the representative voltages are calculated as average voltages of the battery voltages measured in the respective voltage measurement systems, and the voltage correction method includes a step of calculating a difference between average voltages of different voltage measurement systems, and that the voltage correction values are calculated on the basis of the average voltage differences so that the average voltages between the respective voltage measurement systems will be equalized.

According to the above-mentioned method, the accuracy in measuring a battery voltage can be improved by correcting a voltage offset error occurring between battery blocks or the like in different voltage measurement systems.

It is preferable in the method for correcting a voltage of a secondary battery according to the present invention that the representative voltages are calculated without measured voltages of batteries that have been determined to be abnormal in the respective voltage measurement systems.

According to this method, the accuracy in measurement of the battery voltage can be improved further by calculating the representative (average) voltages without the measured voltages of batteries that have been determined to be abnormal.

It is also preferable in a method for correcting a voltage of a secondary battery according to the present invention that the representative voltages are calculated without the measured voltages whose deviations from the representative voltages in the respective voltage measurement systems exceed a predetermined range.

According to this method, the accuracy in measurement of the battery voltages can be improved further by calculating again the representative (average) voltages without the measured voltage having a large deviation from the representative (average) voltages.

It is also preferable in a method for correcting a voltage of a secondary battery according to the present invention that the representative voltages are calculated without measured voltages of batteries whose temperatures are different from those of the remaining batteries in the respective voltage measurement systems and the differences are greater than a predetermined value.

In a battery system, among the plural battery blocks composing a battery pack or the like, battery blocks arranged at the both ends will have temperature differences more easily than the remaining battery blocks do, and this results in a capacity difference and causes a voltage difference. According to this method, the accuracy in measurement of the battery voltages can be improved further by excluding the measured voltages of the battery blocks at the both ends from the calculation of the representative (average) voltages.

It is also preferable in a method for correcting a voltage of a secondary battery according to the present invention that the representative voltages are calculated without the measured voltage obtained from a voltage measurement system that has been determined to be abnormal.

According to this method, since the influence of an offset error caused by an abnormal circuit system can be avoided, the accuracy in measurement of the battery voltages can be improved further.

It is also preferable in a method for correcting a voltage of a secondary battery according to the present invention that the method includes a step of calculating average values of the voltage correction values in a predetermined period of time.

According to this method, factors other than the circuit errors can be excluded from the voltage correction values, and thus the accuracy in measurement of the battery voltages can be improved further.

For achieving the above-mentioned object, a method for estimating a state of charge of a secondary battery according to the present invention includes a step of calculating a state of charge of each secondary battery on the basis of the battery voltage obtained by the method for correcting a voltage of the secondary battery according to the present invention.

According to this method, the reliability of a battery control can be improved since a battery voltage with an improved measurement accuracy is used for SOC estimation. It has advantages, particularly for example, that the SOC estimation error between the battery blocks is reduced to improve the SOC estimation accuracy and that also finding an equal charging period precisely is possible.

For achieving the object, an apparatus for correcting a voltage of a secondary battery according to the present invention is an apparatus for correcting battery voltages measured in a battery system having plural voltage measurement systems and having plural secondary batteries in each of the voltage measurement systems, and the apparatus is characterized in that it includes voltage measuring parts provided in the respective voltage measurement systems so as to measure the voltages of the plural secondary batteries; a representative voltage calculating part for calculating representative voltages from the battery voltages measured by the voltage measuring parts; a voltage correction value calculating part for calculating voltage correction values on the basis of the respective representative voltages; and a correction value reflecting part for correcting the measured voltages of the secondary batteries in each of the voltage measurement systems, on the basis of the voltage correction values.

It is preferable in the apparatus for correcting a voltage of a secondary battery according to the present invention that the representative voltage calculating part calculates a representative voltage as an average voltage of battery voltages measured in the respective voltage measurement systems, and that the voltage correction apparatus has an average voltage difference calculating part for calculating a difference between average voltages of different voltage measurement systems, and the voltage correction value calculating part calculates the voltage correction value on the basis of the average voltage differences so that the average voltages in the respective voltage measurement systems will be equalized.

According to the above-mentioned configuration, the accuracy in measurement of the battery voltages can be improved by correcting the voltage offset errors that occur, for example, between battery blocks for different voltage measurement systems.

It is preferable in the apparatus for correcting a voltage of a secondary battery according to the present invention that the representative voltage calculating part calculates the representative voltage without a measured voltage of a battery that has been determined to be abnormal in each of the voltage measurement systems.

According to this configuration, the accuracy in measurement of the battery voltage can be improved further by calculating the representative (average) voltage without the measured voltage of a battery that has been determined to be abnormal.

It is also preferable in an apparatus for correcting a voltage of a secondary battery according to the present invention that the representative voltage calculating part calculates a representative voltage without a measured voltage whose deviation from the representative voltage in each voltage measurement system exceeds a predetermined range.

According to this configuration, the accuracy in measurement of the battery voltage can be improved further by calculating again the representative (average) voltage without the measured voltage that has a large deviation from the representative (average) voltage.

It is also preferable in an apparatus for correcting a voltage of a secondary battery according to the present invention that the representative voltage calculating part calculates a representative voltage without a measured voltage of a battery whose temperature differs from those of the remaining batteries in each voltage measurement system and the difference is greater than a predetermined value.

In a battery system, among plural battery blocks composing a battery pack or the like, battery blocks that are arranged at the both ends will have temperature differences more easily than the remaining battery blocks do, and this results in a capacity difference and a voltage difference. According to this configuration, the accuracy in measurement of the battery voltage can be improved further by excluding the measured voltages of the battery blocks at the both ends from the calculation of the representative (average) voltage.

It is also preferable in an apparatus for correcting a voltage of a secondary battery according to the present invention that the representative voltage calculating part calculates the representative voltage without the measured voltage obtained from a voltage measurement system that has been determined to be abnormal.

According to this configuration, the influence of an offset error caused by the abnormal circuit system can be avoided, and thus the accuracy in measurement of the battery voltage can be improved further.

Preferably, the apparatus for correcting a voltage of a secondary battery according to the present invention has a correction value averaging part for calculating an average value of the voltage correction value in a predetermined period of time.

According to this configuration, factors other than the circuit errors can be excluded from the voltage correction value, and thus the accuracy in measurement of the battery voltage can be improved further.

For achieving the above-mentioned object, an apparatus for estimating a state of charge of a secondary battery according to the present invention includes a state of charge calculating part for calculating a state of charge for each secondary battery on the basis of the battery voltage obtained by a correction value reflecting part in the apparatus for correcting voltage of the secondary battery according to the present invention.

According to this configuration, since a battery voltage having an improved measurement accuracy is used for estimating the SOC, the reliability of battery control will be improved. It has advantages, particularly for example, that the SOC estimation error between the battery blocks is reduced to improve the SOC estimation accuracy and that also finding an equal charging period precisely is possible.

DESCRIPTION OF THE INVENTION

Hereinafter, preferred embodiments of the present invention will be described by referring to the attached figures.

Figure 1:
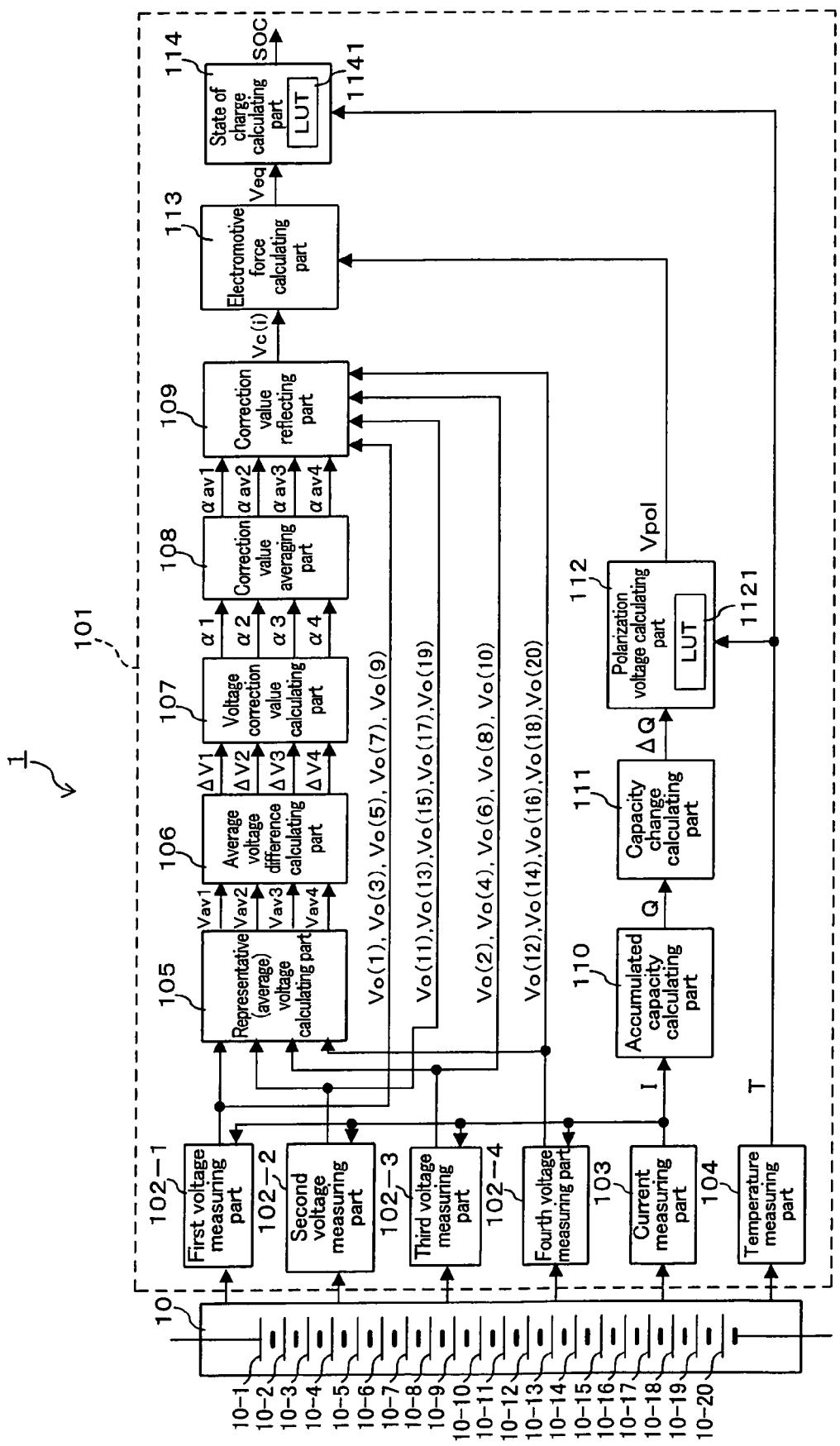
FIG. 1 is a block diagram showing an exemplary configuration of a battery pack apparatus including a voltage correction apparatus and a state of charge estimation apparatus for a secondary battery according to one embodiment of the present invention.

FIG. 1 is a block diagram showing one exemplary configuration of a battery pack apparatus including a voltage correction apparatus and a state of charge estimation apparatus for a secondary battery according to one embodiment of the present invention. In FIG. 1, the battery pack apparatus 1 includes a battery pack 10, and an electronic control unit (hereinafter, abbreviated as ECU) 101 for a battery. The ECU 101 is a part of a microcomputer system and includes a voltage correction apparatus and a state of charge estimation apparatus.

For obtaining a predetermined output with respect to a motor, the battery pack 10 mounted on a: HEV or the like is configured typically with, for example, plural battery blocks composed of plural cells or unit cells (battery module) as nickel-metal hydride batteries that are connected electrically in series, where the battery blocks are electrically connected further in series. In FIG. 1, the battery pack 10 is composed of twenty battery blocks of 10-1, 10-2, ... and 10-20. In FIG. 1, each of the respective battery blocks is expressed as an electric symbol for a single cell for convenience. The battery blocks 10-(2$i$-1) ($i$=1-10) are called odd-number battery blocks and the battery blocks 10-2$i$ ($i$=1-10) are called even-number battery blocks.

In the battery ECU 101, numeral 102-1 denotes a first voltage measuring part that is provided in a first voltage measurement system corresponding to five battery blocks of 10-1, 10-3, 10-5, 10-7 and 10-9 so as to measure terminal voltages of the respective battery blocks detected by a voltage sensor (not shown) as voltage data V(i) (i=1, 3, 5, 7, 9) at a predetermined sampling period.

Numeral 102-2 denotes a second voltage measuring part that is provided in a second voltage measurement system corresponding to five battery blocks of 10-11, 10-13, 10-15, 10-17 and 10-19 so as to measure terminal voltages of the respective battery blocks detected by a voltage sensor (not shown) as voltage data V(i) (i=11, 13, 15, 17, 19) at a predetermined sampling period.

Numeral 102-3 denotes a third voltage measuring part that is provided in a third voltage measurement system corresponding to five battery blocks of 10-2, 10-4, 10-6, 10-8 and 10-10 so as to measure terminal voltages of the respective battery blocks detected by a voltage sensor (not shown) as voltage data V(i) (i=2, 4, 6, 8, 10) at a predetermined sampling period.

Furthermore, numeral 102-4 denotes a fourth voltage measuring part that is provided in a fourth voltage measurement system corresponding to five battery blocks of 10-12, 10-14, 10-16, 10-18 and 10-20 so as to measure terminal voltages of the respective battery blocks detected by a voltage sensor (not shown) as voltage data V(i) (i=12, 14, 16, 18, 20) at a predetermined sampling period.

As mentioned above with respect to conventional techniques, at the respective voltage measuring parts, a primary voltage-current line (approximate line) is obtained by statistical processing using least squares for example, from a plurality of data sets of measured voltage data V(i) and current data I from a current measuring part 103 mentioned below, and a no-load voltage as a voltage value (voltage (V) intercept) corresponding to 0 current is calculated as a voltage data Vo(i).

Numeral 103 denotes a current measuring part for measuring a charging/discharging current of the battery pack 10 detected as current data I by a current sensor (not shown) (the sign represents the charging/discharging direction) at a predetermined sampling period. Numeral 104 denotes a temperature measuring part for measuring the temperature of the battery pack 10 detected as temperature data T by a temperature sensor (not shown).

The voltage data Vo(i) (i=1, 3, 5, 7, 9) from the first voltage measuring part 102-1, the voltage data Vo(i) (i=11, 13, 15, 17, 19) from the second voltage measuring part 102-2, the voltage data Vo(i) (i=2, 4, 6, 8, 10) from the third voltage measuring part 102-3, and the voltage data Vo(i) (i=12, 14, 16, 18, 20) from the fourth voltage measuring part 102-4 are inputted to a representative (average) voltage calculating part 105.

At the representative voltage calculating part 105, the following proceedings are performed. First, an average voltage Vav1 of voltage data Vo(3), Vo(5), Vo(7) and Vo(9), except for the voltage data Vo(1) that corresponds to the battery block 10-1 disposed at the first end of the battery pack 10, is calculated as a representative voltage of the first voltage measurement system. An average voltage Vav2 of voltage data Vo(11), Vo(13), Vo(15) and Vo(17), except for the voltage data Vo(19) that corresponds to the battery block 10-19 disposed at the next inside of the second end of the battery pack 10, is calculated as a representative voltage of the second voltage measurement system. An average voltage Vav3 of voltage data Vo(4), Vo(6), Vo(8), and Vo(10), except for the voltage data Vo(2) that corresponds to the battery block 10-2 disposed at the next inside of the first end of the battery pack 10, is calculated as a representative voltage of the third voltage measurement system. Furthermore, an average voltage Vav4 of voltage data Vo(12), Vo(14), Vo(16) and Vo(18), except for the voltage data Vo(20) that corresponds to the battery block 10-20 disposed at the second end of the battery pack 10, is calculated as a representative voltage of the fourth voltage measurement system.

Here, the voltage data Vo(1), Vo(2), Vo(19) and Vo(20), which correspond respectively to the battery blocks 10-1, 10-2, 10-19 and 10-20 disposed at the both ends and at next inside of the ends of the battery pack 1, are excluded from the calculation of the average voltages due to the following reasons. Temperature differences will occur more easily at the battery blocks disposed at the both ends and their vicinities than at the remaining battery blocks, and this will result in a capacity difference that causes a voltage difference. Therefore, the voltages measured at the battery blocks at the both ends are excluded from calculation of the representative (average) voltages so as to improve further the accuracy in measurement of the battery voltages.

At the representative (average) voltage calculating part 105, the data as mentioned below will be excluded from calculation of the average voltage: voltage data corresponding to a battery block that has been determined to be abnormal due to a considerable variation in the battery capacity or the like; voltage data whose deviation from the calculated average voltage exceeds a predetermined range; and voltage data from a voltage measurement circuit system that has been determined to be abnormal due to breakdown or the like of a cable extending from the battery pack 10 to the battery ECU 101.

The average voltages Vav1, Vav2, Vav3 and Vav4 from the representative (average) voltage calculating part 105 are inputted to an average voltage difference calculating part 106. The average voltage calculating part 106, for different voltage measurement systems for example, calculates an average voltage difference $\Delta V1$ at the first voltage measurement system and an average voltage difference $\Delta V3$ at the third voltage measurement system, on the basis of differences (Vav1−Vav3, Vav3−Vav1) between an average voltage Vav1 corresponding to the battery blocks 10-3, 10-5, 10-7 and 10-9 in the first voltage measurement system and an average voltage Vav3 corresponding to adjacent battery blocks 10-4, 10-6, 10-8 and 10-10 in the third voltage measurement system, as well as a difference (((Vav1+Vav3)−(Vav2+Vav4))/2) between an average value of the average voltages Vav1 and Vav3 at the first and third voltage measurement systems and an average value of the average voltages Vav2 and Vav4 at the second and fourth voltage measurement systems.

The average voltage calculating part 106, for different voltage. measurement systems for example, calculates an average voltage difference $\Delta V2$ at the second voltage measurement system and an average voltage difference $\Delta V4$ at the fourth voltage measurement system, on the basis of differences (Vav2−Vav4, Vav4−Vav2) between an average voltage Vav2 corresponding to the battery blocks 10-11, 10-13, 10-15 and 10-17 in the second voltage measurement system and an average voltage Vav4 corresponding to adjacent battery blocks 10-12, 10-14, 10-16 and 10-18 in the fourth voltage measurement system, as well as a difference (((Vav1+Vav3)−(Vav2+Vav4))/2) between an average value of the average voltages Vav1 and Vav3 at the first and third voltage measurement systems and an average value of the average voltages Vav2 and Vav4 at the second and fourth voltage measurement systems.

The voltage correction value calculating part 107, when receiving the average voltage differences $\Delta V1$, $\Delta V2$, $\Delta V3$ and $\Delta V4$ from the average voltage difference calculating part 106, calculates the respective voltage correction values $\alpha 1$, $\alpha 2$, $\alpha 3$ and $\alpha 4$ so that the average voltages in the first to fourth voltage measurement systems will be equalized. The correction value-averaging part 108 calculates average values $\alpha av1$, $\alpha av2$, $\alpha av3$ and $\alpha av4$ of the voltage correction values $\alpha 1$, $\alpha 2$, $\alpha 3$ and $\alpha 4$ from the voltage correction value calculating part 107 in a predetermined period of time (for example, several seconds).

The correction value reflecting part 109, when receiving the average values $\alpha av1$, $\alpha av2$, $\alpha av3$ and $\alpha av4$ from the voltage correction value calculating part 107, adds the average values $\alpha av1$, $\alpha av2$, $\alpha av3$ and $\alpha av4$ of the voltage correction values respectively to the voltage data Vo(i) (i=1, 3, 5, 7, 9) of the first voltage measurement system, the voltage data Vo(i) (i=11, 13, 15, 17, 19) of the second voltage measurement system, the voltage data Vo(i) (i=2, 4, 6, 8, 10) of the third voltage measurement system, and the voltage data Vo(i) (i=12, 14, 16, 18, 20) of the fourth voltage measurement system, and outputs corrected voltage data Vc(i)=(i=1-20) that correspond to each of the battery blocks.

The current data I from the current measuring part 103 is inputted to the accumulated capacity calculating part 110 so that an accumulated capacity Q in a predetermined period of time is calculated. The accumulated capacity Q calculated by the accumulated capacity calculating part 110 is inputted to a capacity change calculating part 111 so that a variation (capacity change) $\Delta Q$ of the accumulated capacity Q in a predetermined period of time (for example, one minute) is obtained. The capacity change $\neq Q$ is inputted to a polarization voltage calculating part 112. The polarization voltage calculating part 112, calculates a polarization voltage Vpol on the basis of the temperature data T measured at the temperature measuring part 104, with reference to a characteristic curve or formula for obtaining the polarization voltage Vpol based on the capacity charge $\Delta Q$ and temperature as a parameter, which has been stored in a look-up table (LUT) 1121. For the case of use in a HEV for example, a characteristic curve that can correspond to a temperature range from −30° C. to +60° C. is stored in the LUT1121 as look-up data.

Next, as mentioned above, the electromotive force calculating part 113 calculates an electromotive force Veq (epuilibrium potential) by subtracting the polarization voltage Vpol obtained by the polarization voltage calculating part 112 from the correction voltage data Vc(i) obtained by the correction value reflecting part 109. The thus calculated electromotive force Veq is inputted to a state of charge calculating part 114. The state of charge calculating part 114 calculates a state of charge (SOC) for each battery block on the basis of temperature data T measured at the temperature measuring part 104, with reference to a characteristic curve or formula for obtaining the electromotive force Veq based on the state of charge (SOC) and temperature as a parameter, which has been stored in a look-up table (LUT) 1141. For the case of use in a HEV for example, a characteristic curve that can correspond to a temperature range from −30° C. to +60° C. is stored as look-up data in the LUT1141.

Next, a processing procedure for estimating a state of charge by using a corrected battery voltage in a battery pack apparatus configured as mentioned above will be explained below by referring to FIG. 2.

Figure 2:
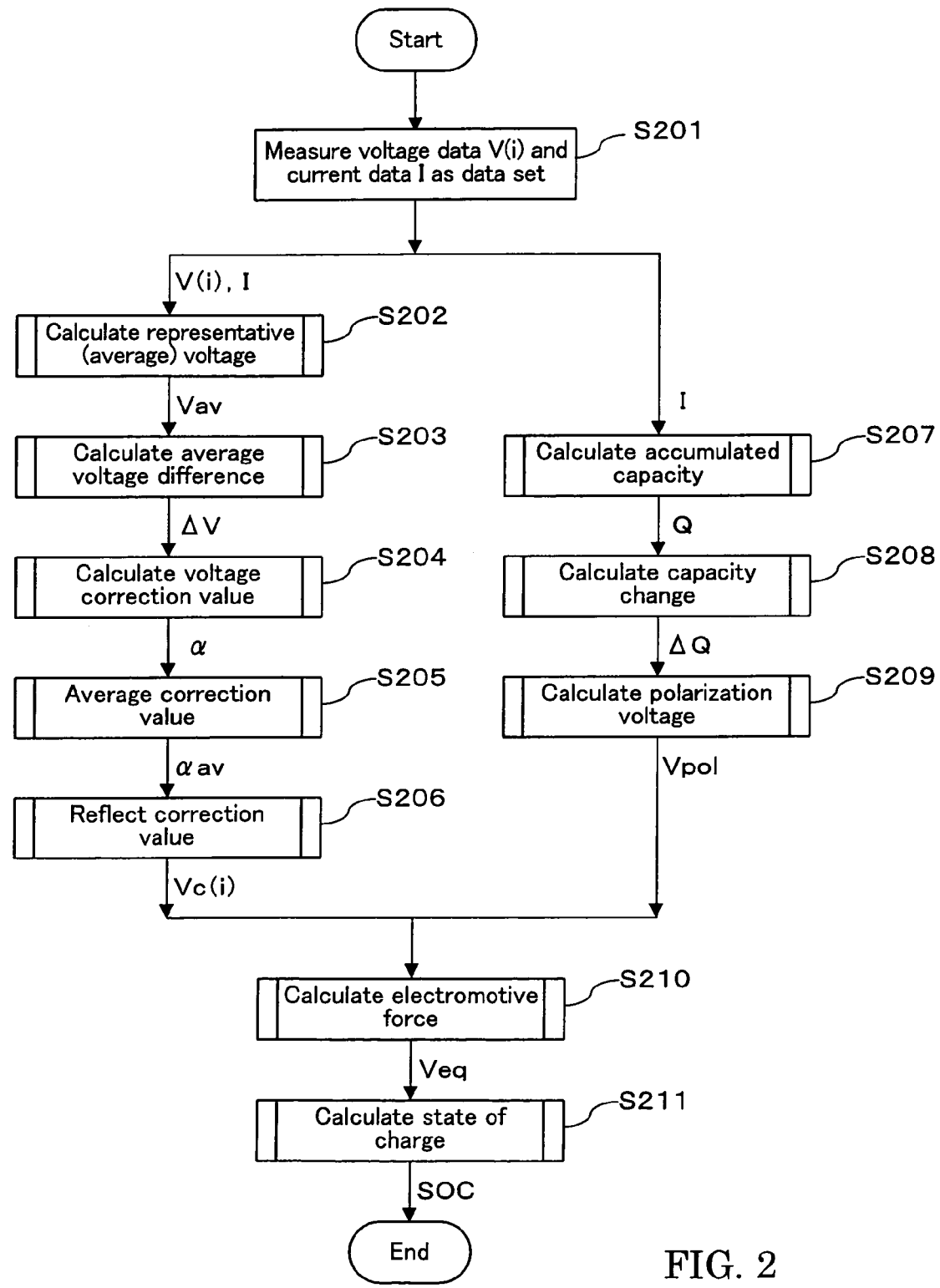
FIG. 2 is a flow chart showing a processing procedure in a state of charge estimation method using a voltage correction method for a secondary battery according to one embodiment of the present invention.

FIG. 2 is a flow chart showing a processing procedure in a state of charge estimation method using a voltage correction method for a secondary battery according to one embodiment of the present invention. In FIG. 2, first, voltage data V(i) and current data I are measured as a data set (S201). Next, in the representative (average) voltage calculation step S202, as mentioned above, average voltages Vav1–Vav4 are calculated. Specifically, an average voltage Vav1 in the first voltage measurement system is calculated from the voltage data Vo(i) (i=3, 5, 7, 9) obtained by the first voltage measuring part 102-1, an average voltage Vav2 in a second voltage measurement system is calculated from the voltage data Vo(i) (i=11, 13, 15, 17) obtained by the second voltage measuring part 102-2, an average voltage Vav3 in the third voltage measurement system is calculated from the voltage data Vo(i) (i=4, 6, 8, 10) obtained by the third voltage measuring part 102-3, and an average voltage Vav4 in the fourth voltage measurement system is calculated from the voltage data Vo(i) (i=12, 14, 16, 18) obtained by the fourth voltage measuring part 102-4 (in FIG. 2, they are expressed generically as Vav).

Next, in an average voltage difference calculation step S203, an average voltage difference $\Delta V1$ with respect to the first voltage measurement system and an average voltage difference ΔV3 with respect to the third voltage measurement system are calculated from a difference between the average voltage Vav1 in the first voltage measurement system and the average voltage Vav3 in the third voltage measurement system, as well as a difference between an average value of the average voltages Vav1 and Vav3 and an average value obtained from the average voltage Vav2 in the second voltage measurement system and the average voltage Vav4 in the fourth voltage measurement system. Similarly, an average voltage difference ΔV2 with respect to the second voltage measurement system and an average voltage difference ΔV4 with respect to the fourth voltage measurement system are calculated on the basis of a difference between an average voltage Vav2 in the second voltage measurement system and an average voltage Vav4 in the fourth voltage measurement system, as well as a difference between the average value of the average voltages Vav1 and Vav3 and an average value of the average voltage Vav2 and the average voltage Vav4.

Next, in a voltage correction value calculation step S204, voltage correction values α1, α2, α3 and α4 are calculated respectively from the average voltage differences ΔV1, ΔV2, ΔV3 and ΔV4 so that the average voltages in the first to fourth voltage measurement systems will be equalized. Next, in a correction value equalization step S205, average values αav1, αav2, αav3 and αav4 of the voltage correction values α1, α2, α3 and α4 in a predetermined period of time (for example, several seconds) are calculated.

Next, in a correction value reflection step S206, average values αav1, αav2, αav3 and αav4 of the voltage correction-values are added respectively to the voltage data Vo(i) (i=1, 3, 5, 7, 9) of the first voltage measurement system, the voltage data Vo(i) (i=11, 13, 15, 17, 19) of the second voltage measurement system, the voltage data Vo(i) (i=2, 4, 6, 8, 10) of the third voltage measurement system and the voltage data Vo(i) (i=12, 14, 16, 18, 20) of the fourth voltage measurement system. Thereby corrected voltage data Vc(i) (i=1-20) corresponding to each of the battery blocks are obtained.

In an accumulated capacity calculation step 207, an accumulated capacity Q is calculated by a current accumulation on the basis of the current data I measured in the step S201. Next, in a capacity change calculation step S208, a variation (capacity change) ΔQ of the accumulated capacity Q in a predetermined period of time (for example, one minute) is calculated. Then, in a polarization voltage calculation process S209, a polarization voltage Vpol is calculated from the capacity change ΔQ, on the basis of a look-up table where polarization voltage Vpol-ΔQ characteristic data with temperature data T being a parameter have been stored.

Next, in an electromotive force calculation step S210, a polarization voltage Vpol that is calculated in a polarization voltage calculation step S209 is subtracted from the correction voltage data Vc(i) calculated in the correction value reflection step S206 so as to calculate an electromotive force Veq. Then, in a state of charge calculation step S211, SOC will be calculated from the electromotive force Veq calculated in the electromotive force calculation step S210 on the basis of a look-up table where an electromotive force Veq—SOC characteristic data with temperature data T being a parameter have been stored.

As mentioned above, according to this embodiment, it will be possible to correct a voltage difference (offset error) that occurs between the odd-number battery blocks 10-(2i-1) (i=1-10) and the even-number battery blocks 10-2i (i=1-10) in the battery pack 10. Thereby, reliability in battery control can be improved by using a battery voltage with an improved measurement accuracy for estimation of the SOC. Particularly, this provides some advantages, for example, that SOC estimation errors between battery blocks can be reduced to improve the SOC estimation accuracy, and also the equal charging period can be found precisely.

In this embodiment, explanation relies on an example of a battery pack apparatus that has four separate voltage measurement systems (first to fourth voltage measurement systems) and that is mounted on a HEV. However, the present invention is not limited to this example, but it can be applied also to a power source system or the like that has two kinds of voltage measurement systems and is equipped with a backup power source.

According to the present invention, it will be possible to provide a method and an apparatus for correcting a voltage of a secondary battery where accuracy for measuring battery voltages between battery blocks corresponding to different voltage measurement systems is improved, and thus realizing a method and an apparatus for estimating SOC accurately even when the measured battery voltage includes an offset error.

INDUSTRIAL APPLICABILITY

A method and an apparatus for correcting a voltage of a secondary battery according to the present invention improves accuracy in measurement of battery voltages between battery blocks corresponding to different voltage measurement systems. Thereby, SOC can be estimated accurately even when the measured battery voltage includes an offset error. And thus, the present invention can be applied preferably electric vehicles such as a pure electric vehicle (PEV), a hybrid electric vehicle (HEV), and a hybrid vehicle having a fuel cell and a secondary battery; and a power source apparatus equipped with a backup power source.

The invention claimed is:

1. A method for correcting a voltage of a secondary battery, the method correcting battery voltages measured in a battery system having plural voltage measurement systems and having plural secondary batteries in each of the voltage measurement systems, and the method comprises steps of:

calculating representative voltages from battery voltages measured in the respective voltage measurement systems in an electronic control unit;

calculating voltage correction values on the basis of the calculated representative voltages in the electronic control unit;

correcting the measured voltages of the secondary batteries in the voltage measurement systems, on the basis of the voltage correction values; and controlling a state of charge of the battery system using the corrected measured voltages.

2. The method for correcting a voltage of a secondary battery according to claim 1, wherein the representative voltages are calculated as average voltages of the battery voltages measured in the respective voltage measurement systems, the method for correcting the voltages of the secondary batteries comprises a step of calculating a difference between average voltages of different voltage measurement systems, and the voltage correction values are calculated on the basis of the average voltage differences so that the average voltages in the voltage measurement systems are equalized.

3. The method for correcting a voltage of a secondary battery according to claim 1, wherein the representative voltages are calculated without measured voltages of batteries that have been determined to be abnormal in the respective voltage measurement systems.

4. The method for correcting a voltage of a secondary battery according to claim 1, wherein the representative voltages are calculated without measured voltages whose deviations from the representative voltages in the respective voltage measurement systems exceed a predetermined range.

5. The method for correcting a voltage of a secondary battery according to claim 1, wherein the representative voltages are calculated without measured voltages of batteries whose temperatures are different from the temperatures of the remaining batteries in the respective voltage measurement systems and the differences are greater than a predetermined value.

6. The method for correcting a voltage of a secondary battery according to claim 1, wherein the representative voltages are calculated without measured voltages from a voltage detection circuit system that has been determined to be abnormal.

7. The method for correcting a voltage of a secondary battery according to claim 1, comprising a step of calculating an average value of the voltage correction values in a predetermined period of time.

8. The method for correcting a voltage of a secondary battery according to claim 1, wherein the secondary battery comprises a battery block composed of plural cells or unit cells connected in series.

9. A method for estimating a state of charge of a secondary battery, the method comprising steps of:
    calculating representative voltages from battery voltages measured by respective voltage measurement systems in a battery system having plural voltage measurement systems and having plural secondary batteries in each of the voltage measurement systems;
    calculating voltage correction values on the basis of calculated representative voltages;
    correcting the measured voltages of the secondary batteries in each of the voltage measurement systems, on the basis of the voltage correction values;
    calculating state of charge of the secondary batteries on the basis of the battery voltages obtained through a step of correcting the measured voltages; and
    controlling the state of charge of the secondary battery using at least the calculated state of charge.

10. An apparatus for correcting a voltage of a secondary battery, the apparatus correcting battery voltages measured in a battery system having plural voltage measurement systems and having plural secondary batteries in each of the voltage measurement systems, wherein the apparatus comprises:
    voltage measuring part provided in the respective voltage measurement systems so as to measure voltages of the secondary batteries;
    a representative voltage calculating part for calculating representative voltages from battery voltages measured by the voltage measuring part;
    a voltage correction value calculating part for calculating voltage correction values on the basis of the respective representative voltages; and
    a correction value reflecting part for correcting the measured voltages of the secondary batteries in each of the voltage measurement systems, on the basis of the voltage correction values.

11. The apparatus for correcting a voltage of a secondary battery according to claim 10, wherein the representative voltage calculating part calculates the representative voltages as average voltages of battery voltages measured in the respective voltage measurement systems, the voltage correction apparatus for a secondary battery comprises an average voltage difference calculating part for calculating differences with respect to average voltages of different voltage measurement systems, and the voltage correction value calculating part calculates the voltage correction values on the basis of the average voltage differences so that average voltages in the respective voltage measurement systems are equalized.

12. The apparatus for correcting a voltage of a secondary battery according to claim 10, wherein the representative voltage calculating part calculates the representative voltages without measured voltages of batteries that have been determined to be abnormal in the respective voltage measurement systems.

13. The apparatus for correcting a voltage of a secondary battery according to claim 10, wherein the representative voltage calculating part calculates the representative voltages without measured voltages whose deviations from the representative voltages in the respective voltage measurement systems exceed a predetermined range.

14. The apparatus for correcting a voltage of a secondary battery according to claim 10, wherein the representative voltage calculating part calculates the representative voltages without measured voltages of batteries whose temperatures are different from the temperatures of the remaining batteries in the respective voltage measurement systems and the differences are greater than a predetermined value.

15. The apparatus for correcting a voltage of a secondary battery according to claim 10, wherein the representative voltage calculating part calculates the representative voltages without measured voltages from a voltage detection circuit system that has been determined to be abnormal.

16. The apparatus for correcting a voltage of a secondary battery according to claim 10, wherein the apparatus comprises a voltage correction value averaging part for calculating an average value of the voltage correction values in a predetermined period of time.

17. The apparatus for correcting a voltage of a secondary battery according to claim 10, wherein the secondary batteries comprise a battery block composed of plural cells or unit cells connected in series.

18. An apparatus for estimating a state of charge of a secondary battery, comprising:
    voltage measuring part for measuring voltages of secondary batteries in a battery system having plural voltage measurement systems and plural secondary batteries in each of the voltage measurement systems, and the voltage measuring part being provided in the respective voltage measurement systems;
    a representative voltage calculating part for calculating representative voltages from battery voltages measured by the voltage measuring part;
    a voltage correction value calculating part for calculating voltage correction values on the basis of the respective representative voltages;
    a correction value reflecting part for correcting the measured voltages of the secondary batteries in each of the voltage measurement systems on the basis of the voltage correction values; and
    a state of charge calculating part for calculating state of charge of the secondary batteries on the basis of battery voltages obtained by the correction value reflecting part.

* * * * *